(12) United States Patent
Dahan

(10) Patent No.: US 9,455,717 B2
(45) Date of Patent: Sep. 27, 2016

(54) DIGITAL COUNTER COMPRISING REDUCED TRANSITION DENSITY

(71) Applicant: Dialog Semiconductor GmbH, Kirchheim/Teck-Nabern (DE)

(72) Inventor: Nir Dahan, Puchheim (DE)

(73) Assignee: Dialog Semiconductor (UK) Limited, London (GB)

( * ) Notice: Subject to any disclaimer, the term of this patent is extended or adjusted under 35 U.S.C. 154(b) by 135 days.

(21) Appl. No.: 14/453,689

(22) Filed: Aug. 7, 2014

(65) Prior Publication Data

US 2015/0207511 A1  Jul. 23, 2015

(30) Foreign Application Priority Data

Jan. 23, 2014 (EP) .................................. 14152342

(51) Int. Cl.
| | | |
|---|---|---|
| H03K 23/00 | (2006.01) | |
| H03K 23/54 | (2006.01) | |
| H03K 23/58 | (2006.01) | |
| H03K 23/40 | (2006.01) | |
| H03K 23/50 | (2006.01) | |

(52) U.S. Cl.
CPC .......... H03K 23/005 (2013.01); H03K 23/542 (2013.01); H03K 23/40 (2013.01); H03K 23/50 (2013.01); H03K 23/588 (2013.01)

(58) Field of Classification Search
None
See application file for complete search history.

(56) References Cited

U.S. PATENT DOCUMENTS

| | | | | |
|---|---|---|---|---|
| 3,373,421 A * | 3/1968 | Wang | .................. | H03M 7/16 341/97 |
| 3,588,461 A * | 6/1971 | Halsall | .................. | H03M 7/16 341/97 |
| 4,264,807 A | 4/1981 | Moen et al. | | |
| 4,408,336 A * | 10/1983 | DasGupta | ............ | H03K 23/005 377/116 |
| 4,780,894 A | 10/1988 | Watkins et al. | | |
| 5,020,082 A * | 5/1991 | Takeda | .................. | H03K 23/004 377/108 |
| 5,450,460 A * | 9/1995 | Stodieck | .............. | H03K 21/403 377/24.1 |
| 5,754,614 A * | 5/1998 | Wingen | ............... | H03K 23/005 341/97 |
| 6,314,154 B1 * | 11/2001 | Pontius | ................ | H03K 23/005 377/16 |
| 6,687,325 B1 * | 2/2004 | Wells | .................... | H03K 21/403 365/236 |
| 6,703,950 B2 * | 3/2004 | Yi | .......................... | H03M 7/16 341/159 |
| 7,991,104 B1 * | 8/2011 | Dahan | ................ | H03K 19/0016 377/34 |
| 8,867,694 B1 * | 10/2014 | Gupta | .................. | H03K 23/005 377/118 |
| 2005/0129167 A1 * | 6/2005 | Heimbigner | ......... | H03K 23/005 377/34 |

OTHER PUBLICATIONS

European Search Report 14152342.3-1810 Mailed: Jul. 4, 2014.

* cited by examiner

Primary Examiner — Tuan T Lam
(74) Attorney, Agent, or Firm — Saile Ackerman LLC; Stephen B. Ackerman

(57) ABSTRACT

The present document relates to a digital counter providing counting information comprising at least a first and a second counting module, said counting modules being serially coupled forming a counting module chain; each counting module comprising at least a first and a second digital storage cell, each counting module providing module counting information comprising a width of at least two bits; the counting modules being adapted to change only one bit of said module counting information between two successive counting states; wherein the counting modules are coupled such that the start of counting of the second counting module is triggered by the first counting module if said first counting module once has passed through its possible counting states.

23 Claims, 5 Drawing Sheets

DIGITAL COUNTER COMPRISING REDUCED TRANSITION DENSITY

TECHNICAL FIELD

The present document relates to digital counters. In particular, the present document relates to digital counters providing a reduced number of transitions.

BACKGROUND

Digital counters are well-known in the prior art. Specifically, binary type counters are known that provide digital counting information in form of binary numbers. Furthermore, Gray counters providing Gray counting scheme are used in specific applications. Gray counters provide for a reduced amount of transitions, i.e. bit flipping from 0 to 1 or vice versa per complete counting cycle of the Gray counter. Gray counters have a complex design and require a large chip area. In contrary thereto, binary type counters typically have a simple circuit design but have a great amount of bit transitions within a counting cycle.

SUMMARY

There is a need to provide for an improved digital counter which has an optimized number of bit transitions per complete counting cycle and has a simple and chip-area-efficient design.

According to an aspect, a digital counter providing counting information is disclosed. The digital counter comprises at least a first and a second counting module. Each counting module may be a self-contained counting block. Said counting modules are serially coupled thereby forming a counting module chain. In other words, the digital counter is subdivided into a set of counting modules concatenated with each other in order to build a linear counting module chain. Each counting module comprises at least a first and a second digital storage cell. Said digital storage cells may be configured for storing digital information (e.g. one bit each). For example, said digital storage cells may be edge-sensitive flip-flops or level-sensitive latches. Each counting module may provide module counting information comprising a width of at least two bits.

The counting modules (also called stages) are configured to change only one bit of said module counting information during counting between two successive counting states. In other words, each module changes separately at most one bit at a time. Thus, the counting modules provide a reduced or even optimal bit transition scheme, i.e. the number of bit flipping from 0 to 1 and vice versa is optimized. The counting modules are coupled such that the start of counting of the second counting module is enabled or triggered by the first counting module if said first counting module once has passed through its counting states and reaches its final state. Thereby, the amount of bit transitions while toggling through its possible counting states of the entire digital counter is significantly reduced, and the structure of the digital counter is kept simple and chip-area-efficient, i.e. the chip area covered by the digital counter is reduced compared to other bit-transition-optimized counter structures, e.g. Gray counters.

According to embodiments, the counting information of the digital counter is composed of module counting information of each counting module, e.g. by combining or concatenating module counting information in an output means which outputs the counting information of the digital counter. The counting modules may be arranged in an order according to the significance of the bits that they contribute to the overall counting, i.e. from a low order ($1^{st}$ module) to a higher order ($2^{nd}$ and higher modules). Each counting module comprises a set of outputs wherein each output provides digital information, e.g. a 1-bit digital data stream. The set of outputs of each counting module provides module counting information. The aggregation of module counting information constitutes the digital counting information of the entire digital counter. Specifically, the module counting information of the counting modules is sequentially arranged thereby forming digital counting information of the digital counter. In other words, the overall digital counting information is formed by concatenating the module counting information based on the order of the modules.

According to embodiments, a counting module provides an overflow port providing overflow information in form of an overflow signal. In particular, all counting modules but the last counting module provide an overflow port to provide overflow information. The last counting module is the counting module having the highest order. The overflow port of the first counting module is coupled with the second counting module in order to trigger the start of counting of the second counting module. Said overflow information may be indicative for an overflow or roll-over of a counting module, i.e. the counting module providing multiple counting states (e.g. 00, 10, 11, 01) has finished a whole counting cycle, reached its final state and may start from the beginning. For example, the overflow information may be provided at the turning point (e.g. 01→00) of the counting cycle. The overflow information may be directly or indirectly (via a further logic gate) provided to the second counting module, specifically, to the clock inputs of the digital storage cells of the second counting module. Thereby, the starting time and counting transitions of the second counting module are scheduled by the counting state of the first counting module.

According to embodiments, the first counting module is coupled with the second counting module via a clock enabling logic and/or a clock switching logic. The first counting module may be driven directly by an external clock signal input to the counter. Said clock enabling logic and said clock switching logic may form a synchronization circuitry which implements the synchronization and starting/triggering of the respective higher order counting modules in order to obtain a synchronous digital counter. The clock enabling logic may be adapted to provide clock enabling information (e.g. a clock enabling signal) when one or more lower order counting modules have reached their respective final counting state of its possible counting states of the respective counting module. The clock switching logic may be coupled with the clock enabling logic. The clock switching logic may be adapted to forward a clock signal (which may be the external clock signal) to the second counting module if the clock enabling signal is provided by the clock enabling logic. In other words, the clock switching logic may provide a clock signal to the second counting module based on the clock enabling information and the external clock signal, thereby synchronously triggering a following counting module. Due to said synchronization, the output signals of all counting modules may toggle after the same time with regards to the input clock, thereby providing a synchronous operation of the counter.

The external clock signal may be coupled with the clock input of the storage cells of the first counting module and with the clock switching logic. The clock switching logic may be coupled with the clock inputs of the storage cells of the second counting module. This provides for the distribution of the clock signal to the storage cells and a synchronous operation of all counter transitions.

According to embodiments, at least one individual counting module may be constituted by a Gray counter or a Johnson counter. A Johnson counter is a form of a Gray counting scheme where also only one bit changes at a time. For a 2 bit counter both counters are identical. For 3 bit counters and above, the bit transitions of a Johnson counter, while still having only one bit changing, are different from what is known as 'reflected Gary code'. These counter types provide for an optimized counting scheme comprising a reduced number of bit transitions or bit flipping during a whole counting cycle using the Gray counting scheme or Johnson counting scheme. Thereby, each counting module is bit-transition-optimized, wherein due to the chain-like concatenation of a plurality of said counting modules, a digital counter with a relative simple circuitry is achieved.

According to embodiments, the first and second digital storage cells comprise at least an input, a non-inverted output and an inverted output. The non-inverted output of the first digital storage cell may be connected with the input of the second digital storage cell. Alternatively, the inverted output of the first storage cell may be connected via a digital inverter with the input of the second storage cell. Thereby, the counting module comprises a shift register-like structure, wherein digital information of the first digital storage cell is transferred to the second digital storage cell. In addition, the digital storage cells may comprise a reset input for receiving an asynchronous reset signal, thereby allowing resetting the respective digital storage cell.

According to embodiments, the inverted output of the second digital storage cell of a counting module may be connected with the input of the first digital storage cell of the counting module (e.g. the D input of a D-flip-flop. Alternatively, the non-inverted output of the second digital storage cell of the counting module may be connected via an inverter with the input of the first digital storage cell of the counting module. Thereby a counting module with a ring structure and repetitive counting cycles is obtained.

According to embodiments, the digital storage cells of the first counting module providing the least significant bits of the counter are constituted by level-sensitive latches. The digital storage cells of the first counting module may be triggered by different clock signals being inverted to each other. By providing clock signals inverted to each other to said level-sensitive latches, the digital counter can be driven by a clock signal with reduced clock rate without changing the counting behavior and counting frequency. A digital counter driven by a half rate clock signal and comprising level-sensitive latches within the first counting module may provide the same counting behavior and counting frequency as a digital counter driven by a clock signal with standard clock rate (double of half rate clock signal) and comprising edge-sensitive latches within the first counting module. Thereby, the power efficiency of the digital counter can be further increased. The residual higher order counting modules may comprise digital storage cells constituted by edge-triggered flip-flops. Said edge-triggered flip-flops may also be triggered by said half rate clock signal.

According to embodiments, the digital counter comprises a decoder circuitry for transforming said counting information into a binary number representation. The digital counter provides counting information in a format which is different to an ordinary binary number. For comparing counting informations of different counters or with a binary number or any other kind of processing of the counting information, it may be necessary to convert counting information from its specific format into ordinary binary format. Thereby, the further processing of the counting information is simplified.

According to embodiments, the decoder circuitry comprises multiple independent decoding blocks wherein each decoding block is associated with a single counting module and receives module counting information only of said counting module in order to transform module counting information into a portion of a binary number. A decoding block may comprise one or more logic gates, for example an XOR logic gate. Said modular structure of the decoder circuitry is advantageous because the decoding effort does not depend on the width of the counting information, i.e. the number of counting modules comprised within the digital counter. There is no connectivity between said decoding blocks for performing said decoding, and there is no connectivity of a decoding block with other counting modules other than his associated counting module. Furthermore, the decoding circuit comprises a flat architecture with only one decoding stage, which avoids timing differences due to different numbers of decoding stages.

According to another aspect a counting method is presented. The counting method comprises serially coupling at least a first and a second counting module to form a counting module chain, the counting modules being adapted to respectively change only one bit of said module counting information between two successive counting states. In other words, a counter comprising at least a first and a second serially coupled counting module is provided. The method further comprises counting within the first counting module and providing module counting information of at least two bits for the first counting module. When said first counting module has passed through all counting states of said first counting module, an overflow signal from the first counting module to the second counting module triggers the start of counting of the second counting module.

The method may further comprise counting with the first and second counting module, a counting transition of the second counting module depending on receipt of the overflow signal from the first counting module. Counting transitions of the first and second counting module may be asynchronous or synchronous. In the latter case, a common clock signal may be employed, the clock signal gated by logic before supplied to the second counting module. The logic to gate the clock signal may be driven by the overflow signal from the first counting module as explained above for the digital counter. The method may further comprise a step of converting the digital counting information provided by the individual counting modules into a standard binary representation as explained above.

It should be noted that the above description is focused on a 2-stage counter and can be extended by providing further counting modules to a larger N-stage counter without departing from the general concept laid out above.

Furthermore, the proposed counter and/or the individual counting modules may count up or count down (or in both directions), depending on the application.

It should be further noted that the methods and systems including its preferred embodiments as outlined in the present patent application may be used stand-alone or in combination with the other methods and systems disclosed in this document. Furthermore, all aspects of the methods and systems outlined in the present patent application may be combined in various ways. In particular, the features of the claims may be combined with one another in an arbitrary manner. Further, if not explicitly indicated otherwise, embodiments of the invention can be freely combined with each other.

BRIEF DESCRIPTION OF THE DRAWINGS

The invention is explained below in an exemplary manner with reference to the accompanying drawings, wherein.

DESCRIPTION

Figure 1:
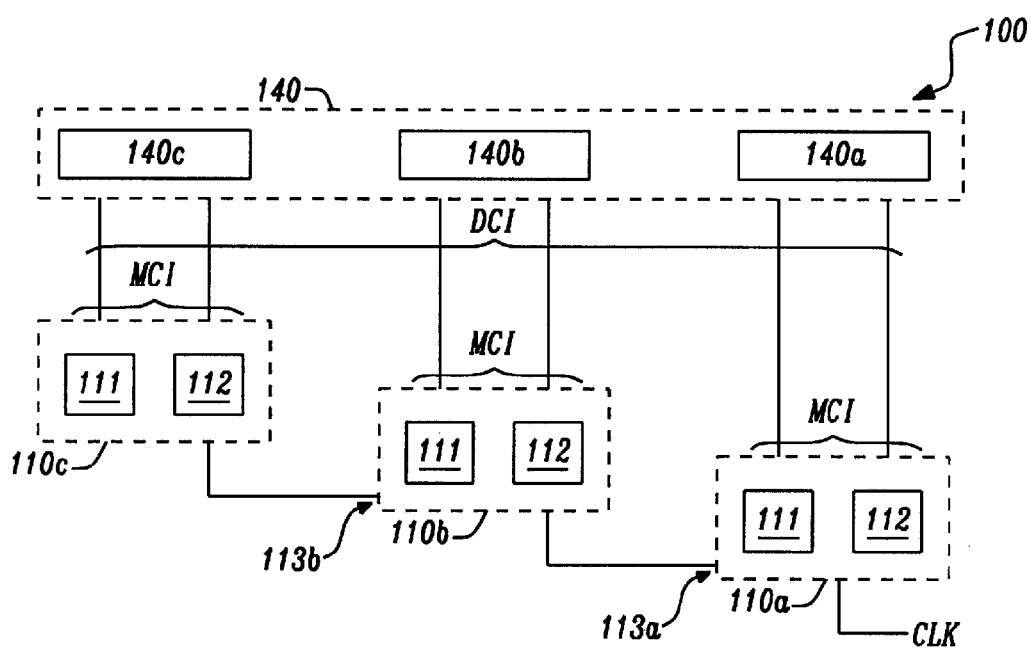
FIG. 1 illustrates an example schematic block diagram of a digital counter.

FIG. 1 shows a schematic structure of a digital counter 100 according to an embodiment based on a block diagram. The digital counter 100 has a modular structure, i.e. the digital counter 100 comprises a plurality of counting modules 110a, 110b, 110c which are serially coupled by an interconnecting circuitry thereby forming a counting module chain. Said interconnecting circuitry may be constituted by an electric wiring or an electric circuitry comprising logic gates.

Each counting module 110a, 110b, 110c comprises at least two digital storage cells 111, 112 which may be constituted by flip-flops or latches. Said digital storage cells 111, 112 may comprise two stable states thereby being configured to store digital information. Said digital storage cells 111, 112 may be electrically interconnected such that the at least two digital storage cells 111, 112 comprised within each counting module 110a, 110b, 110c form a counting unit. Said counting unit may toggle between multiple counting states thereby providing module counting information. The module counting information can be derived from the states of the digital storage cells 111, 112 and may have a width of at least two bits.

In order to lower the power consumption of the digital counter 100, the counting modules 110a, 110b, 110c provide an optimized bit transition scheme, i.e. during operation between two successive counting states only one bit of the module counting information changes. So for example, each counting module 110a, 110b, 110c may provide a module counting information sequence of 00→10→11→01→00 etc. in successive counting states. For example, each counting module 110a, 110b, 110c may be configured as a Gray counter block or a Johnson counter block, i.e. may provide a Gray counting sequence or a Johnson counting sequence, or any other counting sequence in which only one bit changes between two successive counting states.

Each counting module 110a, 110b, 110c provides an overflow port 113a, 113b for providing overflow information. Said overflow information may be provided each time when a respective counting module 110a, 110b, 110c has passed through once all the counting states, e.g. 00→10→11→01 (i.e. completed a counted sequence). If the final counting state, for example "01" is reached, the provision of overflow information triggers the start of counting of the next higher order counting module 110b. Specifically, the start of counting of the second counting module 110b may be triggered based on the rising or falling edge of a digital signal provided by the first counting module 110a as overflow information via an interconnecting circuitry to the second counting module 110b. In other words, if the counter of the first counting module 110a rolls over, the second counting module 110b which is the next one in the counting module chain is advancing. The coupling of the second counting module 110b and the third counting module 110c may also be realized by an interconnection circuitry, wherein the third counting module 110c is triggered by overflow information provided by a second counting module 110b, i.e. the third counting module 110c starts counting when the second counting module 110b rolls over.

As indicated in FIG. 1, each counting module 110a, 110b, 110c provides module counting information, wherein the set of module counting information MCI forms the overall digital counting information, DCI provided by the digital counter 100. Specifically, a module counting information, MCI comprises a set of bits, wherein the digital counting information DCI of the digital counter 100 is obtained by serially assembling the individual module counting information MCI provided by the counting modules 110a, 110b, 110c one after another. In other words, the digital counting information DCI may be obtained by concatenating the module counting information MCI according to the weight of the counting modules.

The digital counter 100 may comprise a decoder circuitry 140 for decoding digital counting information DCI into an ordinary binary number. The decoder circuitry 140 comprises a plurality of decoding blocks 140a, 140b, 140c. Each decoding block 140a, 140b, 140c is associated with a specific counting module 110a, 110b, 110c. Each decoding block 140a, 140b, 140c receives module counting information MCI of the specific counting module 110a, 110b, 110c, with which it is coupled. Specifically, each decoding block 140a, 140b, 140c receives module counting information MCI only from the counting module 110a, 110b, 110c with which it is coupled, i.e. there is no connectivity between different counting modules 110a, 110b, 110c for performing said decoding. Each decoding block 140a, 140b, 140c is adapted to transform the received module counting information MCI into a binary number portion. The resulting binary number may be obtained by assembling said binary number portions sequentially, i.e. the resulting binary number is obtained by arranging said binary number portions serially one after another.

Figure 2:
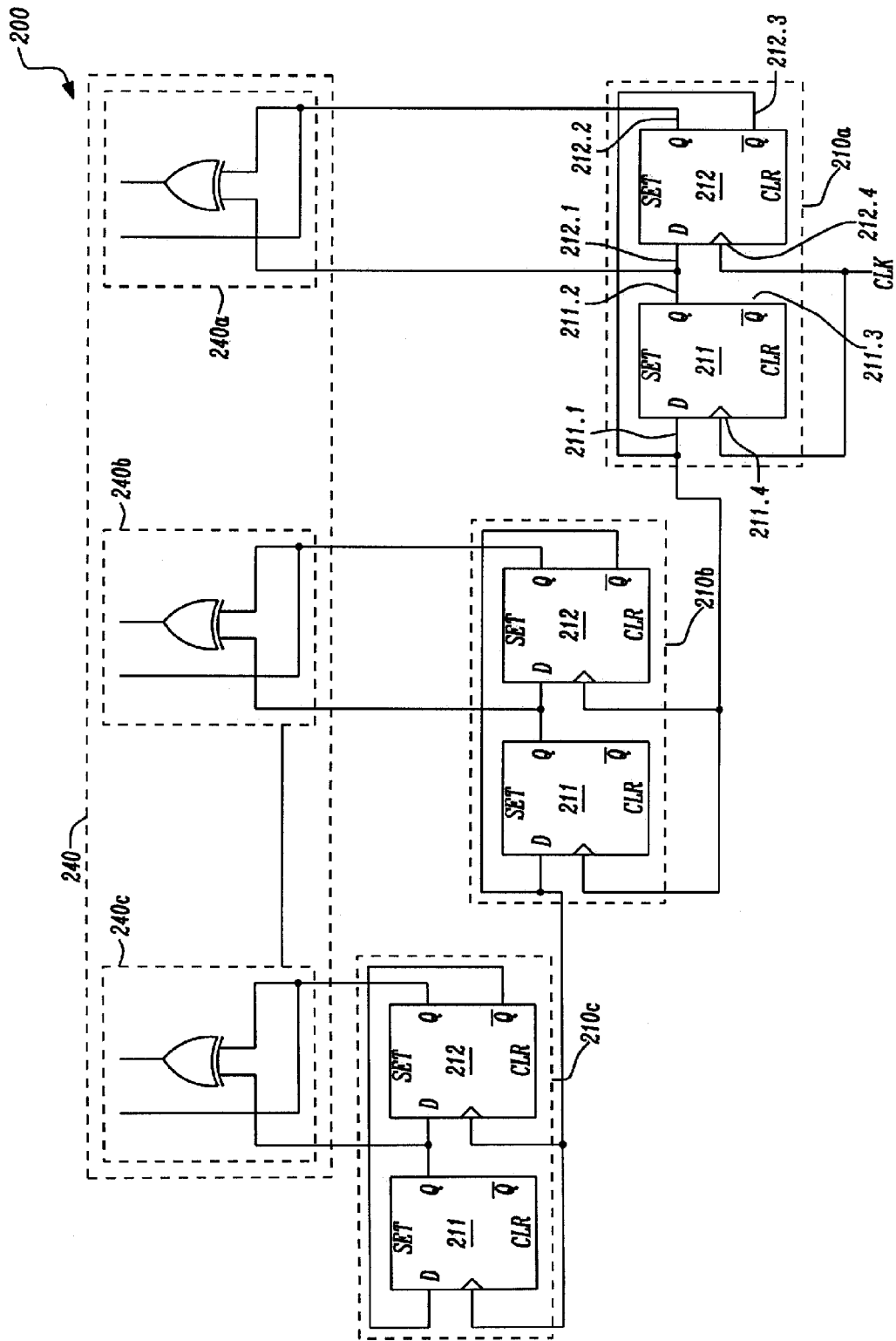
FIG. 2 illustrates an example schematic representation of an asynchronous digital counter according to a first embodiment.

FIG. 2 illustrates an asynchronous digital counter 200 according to an embodiment. The asynchronous digital counter 200 comprises multiple counting modules 210a, 210b, 210c, each counting module providing 2-bit module counting information MCI. Alternatively, each counting module 210a, 210b, 210c may provide a higher number of bits per counting module, for example 3-bit or 4-bit module counting information MCI.

Each counting module of the asynchronous digital counter 200 may comprise at least two digital storage cells 211, 212. According to the present embodiment, said digital storage cells 211, 212 are constituted by flip-flops, specifically edge-sensitive flip-flops, for example D-flip-flops, RS-flip-flops or JK-flip-flops. Each digital storage cell 211, 212 may comprise an input 211.1, 212.1 (e.g. the D-port of a D-flip-flop), a non-inverting output 211.2, 212.2 (e.g. the Q-port of a D-flip-flop) and an inverting output 211.3, 212.3 (e.g. the I-port of a D-flip-flop). Furthermore, each digital storage cell 211, 212 may comprise a clock input 211.4, 212.4 for receiving a clock signal CLK. The digital storage cells 211, 212 may be sensitive to positive edges, i.e. the digital storage cell stores a digital value provided at the input 211.1, 212.1 if a rising edge of CLK occurs. Alternatively, the digital storage cells 211, 212 may be sensitive to negative edges, i.e. the digital storage cell stores a digital value provided at the input 211.1, 212.1 if a falling edge occurs.

It should be noted that the direction of counting is arbitrary. The proposed counters may count up or down or in both directions, following the same principle as set out in this document.

For synchronizing the counting cycles based on the clock signal CLK, said clock signal is connected with the clock inputs 211.4, 212.4 of the digital storage cells 211, 212 providing the least significant counter bits. According to the present embodiment, the interconnections within each counting module are identical. The non-inverting output 211.2 of the first digital storage cell 211 (cell A) is coupled with the input 212.1 of the second digital storage cell 212 (cell B). Alternatively, the inverting output 211.3 of the first digital storage cell 211 may be coupled with the input 212.1 of the second digital storage cell 212 directly or via a digital inverter. Furthermore, the inverting output 212.3 of the second digital storage cell 212 is coupled with the input 211.1 of the first digital storage cell 211, thereby forming a local (partial) counter ring. Alternatively, the non-inverting output 212.2 of the second digital storage cell 212 may be coupled with the input 211.1 of the first digital storage cell 211 directly or via a digital inverter. Such counting module 210a, 210b, 210c may implement a Gray counter block, respectively, a Johnson counter block, i.e. the counting module 210a, 210b, 210c may provide a Gray counting sequence or a Johnson counting sequence.

The counting modules 210a, 210b, 210c may be adapted to provide module counting information MCI based on the states of their first and second digital storage cells 211, 212. Specifically, the module counting information MCI may be provided by the non-inverting outputs 211.2, 212.2 of said digital storage cells 211, 212. Alternatively, module counting information MCI can also be obtained by tapping (and optionally inverting) the signals of the inverting outputs 211.3, 212.3.

The following table T1 shows the counting sequence of a counting module 210a, 210b, 210c of the asynchronous digital counter 200 according to FIG. 2.

TABLE T1

| digital storage cells | |
|---|---|
| B | A |
| 0 | 0 |
| 1 | 0 |
| 1 | 1 |
| 0 | 1 |

In contrary to the ordinary binary number counting sequence, the counting sequence is chosen to change only one bit of the module counting information between two successive counting states. Thus, each one of said counting modules provides a counting sequence with a minimal amount of bit transitions per full counting cycle. Of course, also other counting cycles with a minimal number of bit transitions may be possible.

According to the present embodiment, the input 211.1 of the first digital storage cell 211 of the first counting module 210a (derived from the output 212.2 of the second digital storage cell 212) is coupled with the clock inputs 211.4, 212.4 of the digital storage cells 211, 212 of the following, second counting module 210b by means of an interconnection circuitry coupling said first and second counting modules 210a, 210b. In other words, the digital signal applied to the input 211.1 of the first digital storage cell 211 of the first counting module 210a (derived from the output 212.2 of the second digital storage cell 212) is used as overflow information and provided to the clock inputs 211.4, 212.4 of the digital storage cells 211, 212 of the following, second counting module 210b. The digital storage cells may be sensitive to the rising edge of the digital signal present at the input 211.1 of the first digital storage cell 211 of the first counting module 210a. Thereby, the second counting module 210b may be triggered (clocked) on the transition (AB) 01→00 as overflow information indicating the roll-over of the first counting module 210a. Thus, after roll-over or overflow of the first counting module 210a, the second counting module 210b starts its counting cycle. Similarly, also the following pairs of counting modules, e.g. the second counting module 210b and the further counting module 210c may be coupled in a similar manner. So, for example, the input 211.1 of the first digital storage cell 211 of the second counting module 210b (or the output 212.2 of the second digital storage cell 212) may be coupled with the clock inputs 211.4, 212.4 of the digital storage cells 211, 212 of the further (third) counting module 210c by means of an interconnection circuitry. Thereby, the further counting module 210c starts counting due to the transition 01→00 of the overflow information indicating the roll-over of the second counting module 210b.

Table T2 shows the counting sequence of the digital counter 200 of FIG. 2.

TABLE T2

| counting module 2 | | counting module 1 | | counting module 0 | |
|---|---|---|---|---|---|
| B | A | B | A | B | A |
| 0 | 0 | 0 | 0 | 0 | 0 |
| 0 | 0 | 0 | 0 | 1 | 0 |
| 0 | 0 | 0 | 0 | 1 | 1 |
| 0 | 0 | 0 | 0 | 0 | 1 |
| 0 | 0 | 1 | 0 | 0 | 0 |
| 0 | 0 | 1 | 0 | 1 | 0 |
| 0 | 0 | 1 | 0 | 1 | 1 |
| 0 | 0 | 1 | 0 | 0 | 1 |
| 0 | 0 | 1 | 1 | 0 | 0 |
| ... | | ... | | ... | |
| 0 | 1 | 0 | 1 | 0 | 0 |
| 0 | 1 | 0 | 1 | 1 | 0 |
| 0 | 1 | 0 | 1 | 1 | 1 |
| 0 | 1 | 0 | 1 | 0 | 1 |
| 0 | 0 | 0 | 0 | 0 | 0 |

It is evident from the above figure that the amount of transitions through an entire cycle of the digital counter 200 having three counting modules 210a, 210b, 210c, each counting module 210a, 210b, 210c having a module counting information width of two bits is:

4 (amount of transitions of counting module 210c)+
16 (amount of transitions of counting module 210b)+64 (amount of transitions of counting module 210a)-or in total 84.

In the above example, the counter goes through all possible states, i.e. there are no 'holes' in the counting (unused states). Even though this example covers the entire counting space, this is not necessary and a counting module may not use all possible states and reach its final state without passing through all transitions.

Once a counting module reaches its final state, counting of the next module is triggered or enabled.

This should be compared with 64 transitions for a 6 bit Gray code, and 126 transitions for an ordinary 6 bit binary counter. So in comparison to an ordinary binary counter, the amount of transitions (bits flipping from 0 to 1 or vice versa) and resulting power consumption of the digital counter is considerably reduced.

In general, the amount of transitions S over a full counting cycle for the proposed n-bit digital counter (where n is even) with modules of length 2-bit is:

$$S = \sum_{k=1}^{k=n/2} 2^{2k} = \frac{4}{3} + \frac{4}{3} \cdot 2^n;$$

Table T3 shows a comparison of the total amount of transitions of n-bit counters, namely an ordinary n-bit binary counter, an n-bit Gray counter and an n-bit modular counter according to an embodiment.

TABLE T3

| n-bit binary counter | n-bit modular counter | n-bit Gray counter |
|---|---|---|
| ≈$2*2^n$ | ≈$1.33*2^n$ | $2^n$ |

It is worth mentioning that the proposed modular counter architecture offers a significant improvement over the normal binary counting scheme. The simplicity of counter design and reduced amount of components in comparison to Gray counters architectures offer significant power and area improvements over Gray counters as well as over binary counters.

Referring back to FIG. 2, the digital counter 200 comprises a decoder circuitry 240. Said decoder circuitry 240 is adapted to receive digital counting information DCI, i.e. module counting information MCI of a plurality of counting modules 210a, 210b, 210c, and to transform said digital counting information DCI into an ordinary binary number. Thereby, the comparison of the counting information of the digital counter with a binary number, for example provided by a further module, is simplified.

The decoder circuitry 240 comprises a plurality of decoding blocks 240a, 240b, 240c, wherein each decoding block 240a, 240b, 240c is associated with a specific single counting module 210a, 210b, 210c. In other words, the number of decoding blocks 240a, 240b, 240c and the number of counting modules 210a, 210b, 210c is equal, wherein there is a direct association between a specific counting module 210a, 210b, 210c and a specific decoding block 240a, 240b, 240c and there is no connectivity in-between the decoding blocks 240a, 240b, 240c for performing said decoding.

Each decoding block 240a, 240b, 240c may receive module counting information MCI of at least two bits of the associated counting module 210a, 210b, 210c. Said module counting information MCI may be transformed within the decoding block 240a, 240b, 240c into a portion of a binary number, for example a set of bits according to a binary schema. By combining, i.e. consecutively arranging said set of bits provided by each decoding block 240a, 240b, 240c, a binary number is obtained. The main advantage of said decoding circuitry 240 is that the decoding time necessary for decoding the digital counting information DCI into an ordinary binary number does not depend on the width of the digital counter. In contrast to other counting schemes, for example a Gray code counting, the decoding circuitry 240 does not have a cascaded architecture which increases logic depth as the counter grows.

In more detail, each decoding block 240a, 240b, 240c is connected with the outputs of the digital storage cells 211, 212 of the respective counting modules 210a, 210b, 210c. According to a first embodiment, the each decoding block 240a, 240b, 240c may be coupled with the non-inverting outputs 211.2, 212.2 of the digital storage cells 211, 212. Alternatively, each decoding block 240a, 240b, 240c may be coupled with the inverting outputs 211.3, 212.3 of the digital storage cells 211, 212 via digital inverters. The first bit of the digital number portion provided by the decoder block 240a, 240b, 240c, specifically the less significant bit, may be obtained by combining the digital signals of the outputs of the digital storage cells 211, 212 using an XOR-gate. The more significant bit provided by the decoder block 240a, 240b, 240c may be directly obtained from the output of the second digital storage cell 212.

As shown in FIG. 2, all decoding blocks 240a, 240b, 240c have identical structure, i.e. each decoding block 240a, 240b, 240c comprises a single XOR gate for transforming the output signals of the digital storage cells of the corresponding counting module into a bit of the ordinary binary number provided by the decoder circuitry 240. However, depending on the design of the counting modules 210a, 210b, 210c and the number of bits provided by each counting module 210a, 210b, 210c, the structure of the decoding blocks 240a, 240b, 240c may be different.

A decoding logic for more than 2 bits is also of 'constant depth' and does not result in a 'carry effect'. The conversion could be from the known Gray coding to Binary coding as described in the prior art. It must be mentioned that with a normal n-bit Gray counter, transferring the information to Binary would result in a deep 'tree like' structure, while with the proposed architecture, the conversion is based 'on per module'. For example, for an N-bit counter made of 3-bit Gray modules, the total conversion time of the proposed counter would be the same as for a normal 3-bit Gray-to-binary, regardless of how large N is.

Figure 3:
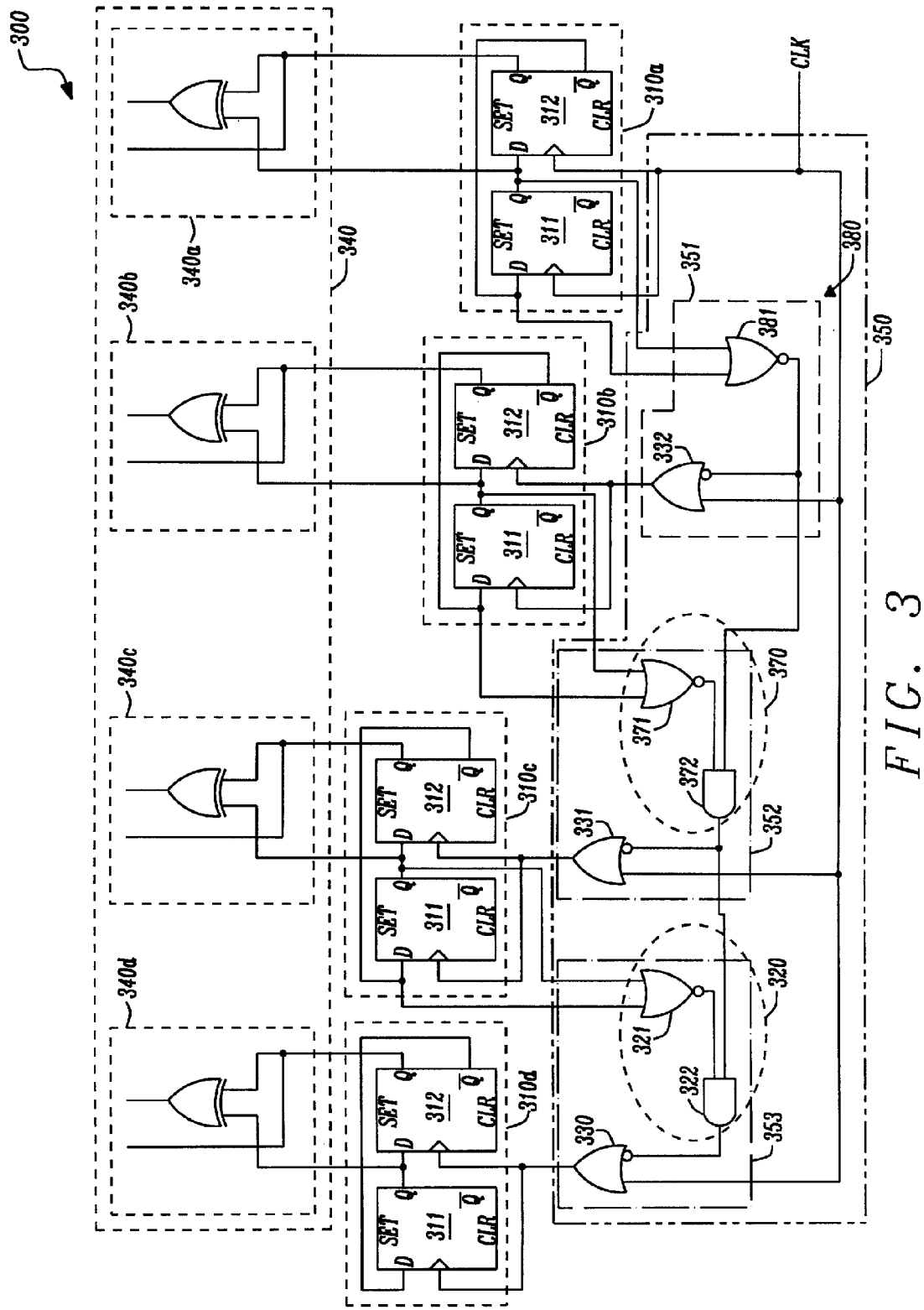
FIG. 3 illustrates an example schematic representation of a synchronous digital counter according to a second embodiment.

FIG. 3 shows a further embodiment of a modular digital counter, namely a synchronous digital counter 300. The general structure of the synchronous digital counter 300 essentially corresponds to the asynchronous digital counter 200 shown in FIG. 2. Therefore only the differences, specifically the technical features realizing the synchronization of the digital counter 300 are described in the following. Otherwise, the above described features of the asynchronous digital counter 200 also apply to the synchronous digital counter 300. As a short summary, the digital counter 300 comprises four counting modules 310a, 310b, 310c, 310d, each counting module providing module counting information MCI to decoding blocks 340a, 340b, 340c, 340d of the decoding circuitry 340. Of course, the number of counting modules may vary depending on the respective application. Said decoding blocks 340a, 340b, 340c, 340d are adapted to transform module counting information MCI into portions of an ordinary binary number, wherein the ordinary binary number is obtained by the consecutive aggregation of the ordinary binary number portions.

In order to obtain a synchronous behavior of the modular digital counter 300, the digital counter 300 comprises a synchronization circuitry 350 which synchronizes the counting behavior of the counting modules 310a, 310b, 310c, 310d. The synchronization circuitry 350 comprises multiple a synchronization circuitry portions 351, 352, 353, wherein each synchronization circuitry portion 351, 352, 353 provides for a synchronized start of counting of a following counting module when the preceding counting module flows over or rolls over, i.e. again starts counting from an initial counting state. So, in other words, each pair of successive counting modules 310a, 310b, 310c, 310d is associated with a synchronization circuitry portion 351, 352, 353.

Each synchronization circuitry portion 351, 352, 353 comprises a clock enabling logic 380, 370, 320 and a clock switching logic 332, 331, 330. The clock enabling logic 380, 370, 320 is adapted to provide an indication when the previous counting module 310a, 310b, 310c or multiple previous counting modules 310a, 310b, 310c has/have reached an overflow state. In other words, the clock enabling logic 380, 370, 320 performs an "end state reached" calculation of the roll-over point in order to determine when the successive counting module 310b, 310c, 310d has to be triggered to start counting. The clock enabling logic 380, 370, 320 may be constituted by a first logic gate 381, 371, 321, for example a NOR-gate as shown in FIG. 3, or any other suitable combinational logic, for example implemented by AND, OR, or MUX elements, which receives the digital signals of the inverted output signal of the second digital storage cell 312 and the non-inverted output signal of the first digital storage cell 311.

For the clock enabling logic 380 that is associated with a pair of counting modules 310a, 310b providing the least significant bits of the digital counting information, the clock enabling signal can be directly derived from the upper-mentioned logic gate, specifically the NOR-gate. Otherwise, the clock enabling logic 370, 320 may comprise a further gate 372, 322 which receives the digital signal provided by the first logic gate 371, 321 and the digital signal provided by an enabling logic 380, 370 of a preceding synchronization circuitry portion 351, 352.

The output of the clock enabling logic 380, 370, 320 may be connected with the clock switching logic 332, 331, 330 of the respective stage. According to the present embodiment, the clock switching logic 332, 331, 330 comprises a logic gate, specifically an OR-gate. In the disclosed example, the clock is gated with an OR gate cell in order to 'park' the clock high when gating. This is not necessarily the only way. One can use other logic gates such as AND gate for a 'park low' strategy. Alternatively one can use memory based clock gates like latch based clock gates or flop based clock gates. Said logic gate receives the inverted signal provided by the clock enabling logic 380, 370, 320 as first input and the common clock signal CLK at the second input. The output of the logic gate, i.e. the output of the clock switching logic 332, 331, 330 is coupled with the clock inputs of the digital storage cells of the counting modules 310b, 310c, 310d.

The clock switching logic is adapted to transmit the positive or rising edge of the clock signal to the clock inputs of the digital storage cells if the clock enabling logic 380, 370, 320 indicates an overflow condition of the preceding counting module (in case of the synchronization circuitry portion 351) or the overflow of a pair of preceding counting modules (in case of synchronization circuitry portions 352, 353).

An advantage of the synchronization circuit portions 351, 352, 353 is that each synchronization circuit portion comprises an identical clock switching logic 332, 331, 330. Thereby, all clock switching logics 332, 331, 330 have identical delay of the clock signal CLK. Thus, the counting modules 310b, 310c, 310d of the digital counter 300 switch (count) synchronously and update all outputs of the digital storage cells at the same time.

Figure 4:
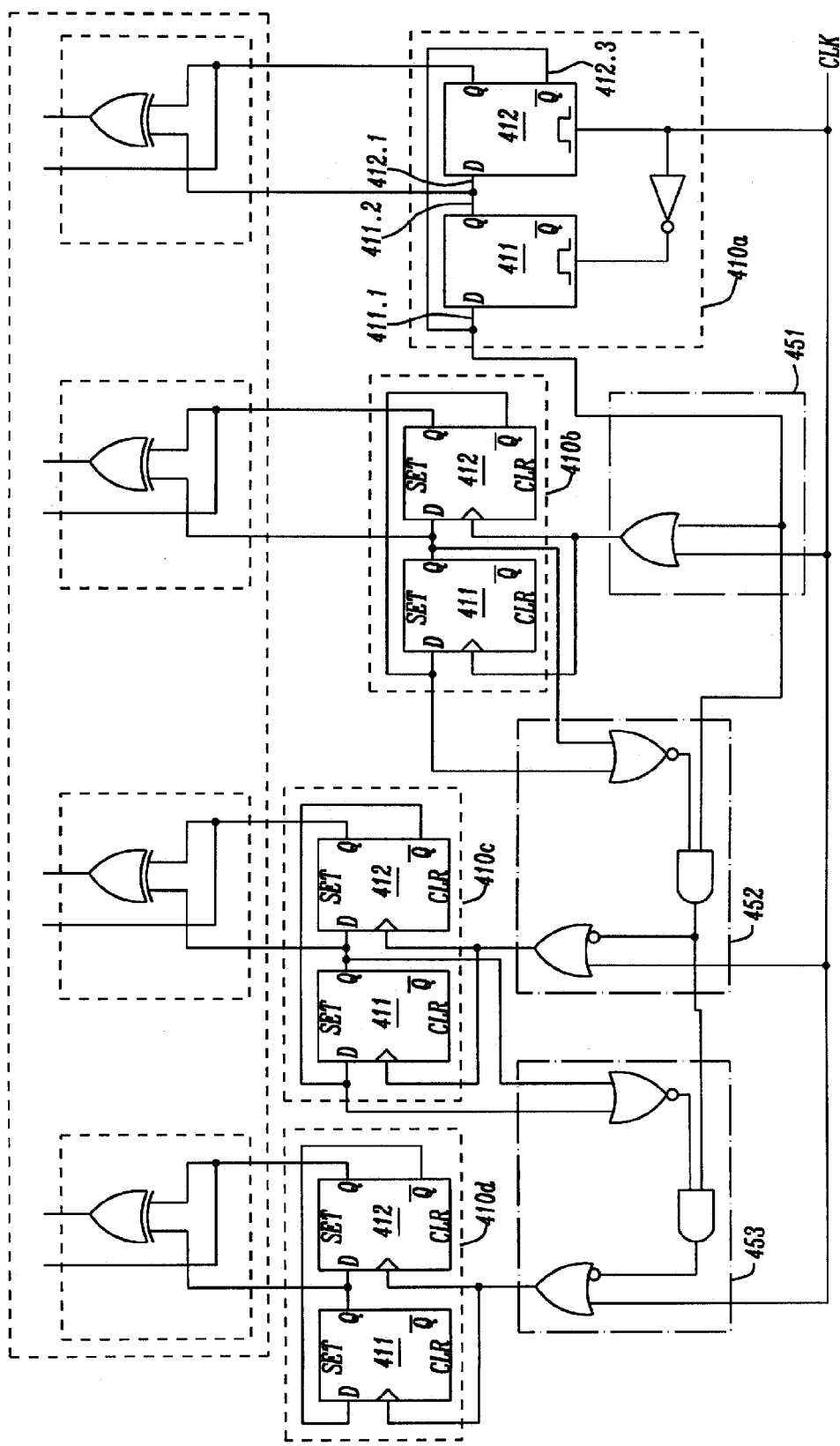
FIG. 4 illustrates an example schematic representation of a synchronous digital counter according to a third embodiment.

FIG. 4 shows a further embodiment of a synchronous digital counter 400. The general structure of the synchronous digital counter 400 essentially corresponds to the synchronous digital counter 300 shown in FIG. 3. Therefore, only the differences are described in the following. Otherwise, the above described features of the synchronous digital counter 300 also apply to the synchronous digital counter 400.

The main difference between the digital counter according to FIGS. 3 and 4 is the configuration of the first counting module 410a and the configuration of the first synchronization circuitry portion 451. The residual higher order counting modules 410b, 410c, 410d and the corresponding synchronization circuitry portions 452, 453 are configured similar to the corresponding modules or portions of the digital counter 300 according to FIG. 3. In detail, the main difference of the first counting module 410a is that the digital storage cells 411, 412 are constituted by level-sensitive latches instead of edge-sensitive flip-flops. The clock input of the first digital storage cell 411 may be coupled via a digital inverter with the clock signal CLK, wherein the clock input of the second digital storage cell 412 may be directly coupled with the clock signal CLK (or vice versa). In other words, the digital storage cells 411, 412 of the first counting module 410a are driven by different clock signals which are inverted to each other.

According to the present embodiment, the non-inverting output 411.2 of the first digital storage cell 411 is coupled with the input 412.1 of the second digital storage cell 412. Furthermore, the inverting output 412.3 of the second digital storage cell 412 is coupled with the input 411.1 of the first digital storage cell 411. The coupling between the inverting output 412.3 and the input 411.1 of the first digital storage cell 411 may comprise a buffer module for buffering the feedback signal. Said counting module 410a may also implement a Gray counter block, respectively, a Johnson counter block, i.e. the counting module 410a may provide a Gray counting sequence or a Johnson counting sequence. Furthermore, the synchronization circuitry portion 451 only consists of a single logic gate, e.g. an OR-gate which is coupled with the input 411.1 of the first digital storage cell 411 of the first counting module 410a and with the clock line providing the clock signal CLK. In other words, the synchronization circuitry portion 451 only comprises a clock switching gate.

By using upper-mentioned counting module 410a comprising level-sensitive latches, a clock signal can be used which comprises only half the frequency in comparison to the clock signal according to FIG. 3 for obtaining the same counting frequency, i.e. flipping of the output signals of the counting modules 410a, 410b, 410c, 410d. Thereby, a significant power reduction can be obtained.

Figure 5:
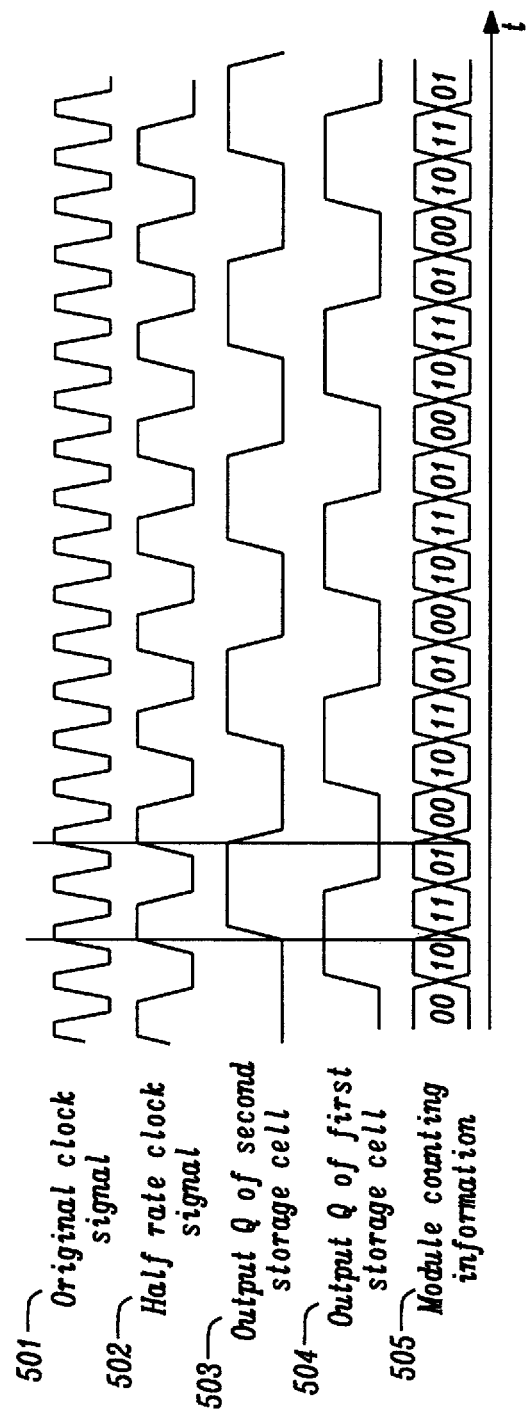
FIG. 5 illustrates an example signal diagram of the first counting module of FIG. 4.

FIG. 5 shows a signal diagram of the behavior of the first counting module 410a of the digital counter 400 according to an embodiment. The first 501 and second 502 rows of the signal diagram show clock signals, wherein the original clock signal shown in the first row 501 is the one used in the digital counter 300 (only shown for reference purposes). The second row 502 has the half rate clock signal which is used in the digital counter 400 according to the present embodiment of FIG. 4. Said half rate clock signal has half the frequency of the original clock signal. The third 503 and fourth 504 row show the output signals of the digital storage cells 411, 412 of the counting module 410a. The module counting information derived from the output signals of the digital storage cells 411, 412 (shown in the last row 505) has the same counting sequence and frequency as the embodiment of FIG. 3, although a clock signal with half the frequency of the original clock signal is used.

Summing up, a modular digital counter using multiple cascaded counting modules with an optimized bit-flipping behavior has been presented, i.e. each module or stage is in itself an efficient reduced transition counter. In this manner, it is possible to reduce the amount of transitions (bits flipping from 0 to 1 or vice versa) by up to 66% and save considerable power.

The mechanism or method can be applied as an asynchronous or synchronous counting mechanism. The main difference to prior art counters is that normal counters are configured as a single counting element. Counting in the normal and popular binary system is easy to implement but has a high amount of transitions (around two times of the possible optimal transition count). Gray counting systems offers optimal transitions per cycle but their implementation is more complicated. The proposed method provides advantages from both worlds, namely a low transition density and low overall transition count (slightly worse than Gray counters, but far better than Binary counters), but is extremely easy and efficient to build, due to its simplicity and low amount of extra gates necessary. Experiments and simulations show that this hybrid approach has advantages in power savings and area savings over both common counter types. It achieves a reduced total number of transitions per counting cycle.

The proposed counter is subdivided into smaller counting modules concatenated in a daisy chain like fashion, where each one of those counting modules has a significant lower (or even optimal) amount of transitions per full counting cycle. Thus, a lower total amount of transitions per counting cycle is achieved while still keeping the counting circuit design simple. The digital counter is scalable for any bit width by cascading identical amount of stages. In case of an odd width, the last stage may be simply truncated. The shown embodiments use counting modules having a 2-bit width. However, the stages can be implemented with any bit width, e.g. 3-bit, 4-bit, 5-bit etc. . . . .

Furthermore, for an interpretation of the counting result, a conversion can be done to the binary system with constant time—i.e. the conversion's logical depth and complexity does not depend on the width of the modular counter.

Another possibility for power reduction is based on the idea of changing the first counting block of the digital counter to use two latches rather than flip-flops and scaling down the frequency of the clock by half. The counting rate at the output of the counter still stays the same—i.e. identical to the counting rate of the flip-flop based design operating with normal clock rate.

In the present document, the term "couple" or "coupled" refers to elements being in electrical communication with each other, whether directly connected e.g., via wires, or in some other manner.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A digital counter comprising:
    at least a first counting module and a second counting module, said counting modules being serially coupled and forming a counting module chain;
    each counting module comprising at least a first digital storage cell and a second digital storage cell, each counting module providing module counting information of at least two bits;
    said counting modules being operative, during counting, to respectively change only one bit of said module counting information between two successive counting state;
    wherein the counting modules are coupled such that the start of counting of the second counting module is enabled by the first counting module when said first counting module has passed through all counting states of said first counting module;
    wherein the digital storage cells of the first counting module comprise level-triggered latches and wherein the digital storage cells of the first counting module are triggered by clock signals that are inverted with respect to each other; and
    wherein the digital storage cells of higher order counting modules comprise edge-triggered flip-flops.

2. The digital counter according to claim 1, comprising output means to provide counting information of the digital counter by combining the module counting information of the counting modules.

3. The digital counter according to claim 1, wherein the first counting module provides an overflow port providing an overflow signal when the first counting module reaches its final counting state, wherein the overflow port of the first counting module is coupled with the second counting module to trigger the counting of the second counting module.

4. The digital counter according to claim 1, wherein the first counting module is coupled with the second counting module via a clock enabling logic and a clock switching logic.

5. The digital counter according to claim 4, wherein the clock enabling logic is configured to provide a clock enabling signal when the first counting module has reached its final counting state.

6. The digital counter according to claim 5, wherein the clock switching logic is coupled with the clock enabling logic, the clock switching logic being configured to forward a clock signal to the second counting module when the clock enabling signal is output by the clock enabling logic.

7. The digital counter according claim 4, wherein a clock signal is coupled with the clock input of the storage cells of the first counting module and with the clock switching logic, the clock switching logic coupled with the clock inputs of the storage cells of the second counting module.

8. The digital counter according to claim 1, wherein at least one counting module comprises a Gray counter or a Johnson counter.

9. The digital counter according to claim 1, wherein the first and second digital storage cells each comprise at least an input, a non-inverted output and an inverted output, and wherein the non-inverted output of the first digital storage cell is connected with the input of the second digital storage cell, or the inverted output of the first digital storage cell is connected via an inverter with the input of the second digital storage cell.

10. The digital counter according to claim 1, wherein the first and second digital storage cells each comprise at least an input, a non-inverted output and an inverted output, wherein the inverted output of the second digital storage cell is connected with the input of the first digital storage cell or wherein the non-inverted output of the second digital storage cell is connected via an inverter with the input of the first digital storage cell.

11. The digital counter according to claim 1, comprising a decoder circuitry for transforming counting information into a binary number representation, wherein the decoder circuitry comprises multiple independent decoding blocks, wherein each decoding block is associated with a single counting module and receives module counting information only of its associated counting module in order to transform module counting information into a portion of a binary number.

12. A counting method comprising the steps of:
serially coupling at least a first and a second counting module to form a counting module chain, the counting modules being configured to respectively change only one bit of said module counting information between two successive counting state;
counting within the first counting module and providing module counting information of at least two bits for the first counting module; and
when said first counting module has passed through all counting states of said first counting module, providing an overflow signal to the second counting module to trigger the start of counting of the second counting module;
wherein the digital storage cells of the first counting module comprise level-triggered latches and wherein the digital storage cells of the first counting module are triggered by clock signals that are inverted with respect to each other; and
wherein the digital storage cells of higher order counting modules comprise edge-triggered flip-flops.

13. A method of providing a digital counter comprising the steps of:
providing at least a first counting module and a second counting module, said counting modules being serially coupled and forming a counting module chain;
providing each counting module comprising at least a first digital storage cell and a second digital storage cell, each counting module providing module counting information of at least two bits;
providing said counting modules being operative, during counting, to respectively change only one bit of said module counting information between two successive counting state;
wherein the counting modules are coupled such that the start of counting of the second counting module is enabled by the first counting module when said first counting module has passed through all counting states of said first counting module,
wherein the digital storage cells of the first counting module comprise level-triggered latches and wherein the digital storage cells of the first counting module are triggered by clock signals that are inverted with respect to each other, and wherein the digital storage cells of higher order counting modules comprise edge-triggered flip-flops.

14. The method of providing a digital counter according to claim 13, comprising output means to provide counting information of the digital counter by combining the module counting information of the counting modules.

15. The method of providing a digital counter according to claim 13, wherein the first counting module provides an overflow port providing an overflow signal when the first counting module reaches its final counting state, wherein the overflow port of the first counting module is coupled with the second counting module to trigger the counting of the second counting module.

16. The method of providing a digital counter according to claim 13 wherein the first counting module is coupled with the second counting module via a clock enabling logic and a clock switching logic.

17. The method of providing a digital counter according to claim 16, wherein the clock enabling logic is configured to provide a clock enabling signal when the first counting module has reached its final counting state.

18. The method of providing a digital counter according to claim 17, wherein the clock switching logic is coupled with the clock enabling logic, the clock switching logic being configured to forward a clock signal to the second counting module when the clock enabling signal is output by the clock enabling logic.

19. The method of providing a digital counter according claim 16, wherein a clock signal is coupled with the clock input of the storage cells of the first counting module and with the clock switching logic, the clock switching logic coupled with the clock inputs of the storage cells of the second counting module.

20. The method of providing a digital counter according to claim 13 wherein at least one counting module comprises a Gray counter or a Johnson counter.

21. The method of providing a digital counter according to claim 13, wherein the first and second digital storage cells each comprise at least an input, a non-inverted output and an inverted output, and wherein the non-inverted output of the first digital storage cell is connected with the input of the second digital storage cell, or the inverted output of the first digital storage cell is connected via an inverter with the input of the second digital storage cell.

22. The method of providing a digital counter according to claim 13, wherein the first and second digital storage cells each comprise at least an input, a non-inverted output and an inverted output, wherein the inverted output of the second digital storage cell is connected with the input of the first digital storage cell or wherein the non-inverted output of the second digital storage cell is connected via an inverter with the input of the first digital storage cell.

23. The method of providing a digital counter according to claim 13, comprising a decoder circuitry for transforming counting information into a binary number representation, wherein the decoder circuitry comprises multiple independent decoding blocks, wherein each decoding block is associated with a single counting module and receives module counting information only of its associated counting module in order to transform module counting information into a portion of a binary number.

* * * * *